United States Patent
Yi et al.

(10) Patent No.: US 10,868,197 B1
(45) Date of Patent: Dec. 15, 2020

(54) STRUCTURE OF MEMORY DEVICE AND FABRICATION METHOD THEREOF

(71) Applicant: United Microelectronics Corp., Hsinchu (TW)

(72) Inventors: Liang Yi, Singapore (SG); Zhiguo Li, Singapore (SG); Chi Ren, Singapore (SG)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/452,311

(22) Filed: Jun. 25, 2019

(30) Foreign Application Priority Data

May 20, 2019 (CN) .......................... 2019 1 0418713

(51) Int. Cl.
- *H01L 29/792* (2006.01)
- *H01L 29/788* (2006.01)
- *H01L 29/423* (2006.01)
- *H01L 29/66* (2006.01)

(52) U.S. Cl.
CPC .... *H01L 29/7923* (2013.01); *H01L 29/42328* (2013.01); *H01L 29/42344* (2013.01); *H01L 29/66825* (2013.01); *H01L 29/66833* (2013.01); *H01L 29/7887* (2013.01)

(58) Field of Classification Search
CPC ........... H01L 29/7923; H01L 29/42328; H01L 29/42344; H01L 29/668825; H01L 29/66833; H01L 29/7887
See application file for complete search history.

(56) References Cited

U.S. PATENT DOCUMENTS

| | | | | |
|---|---|---|---|---|
| 4,958,321 A | * | 9/1990 | Chang | G11C 16/0416 257/E29.306 |
| 6,486,029 B1 | * | 11/2002 | Foote | H01L 27/115 257/E21.679 |
| 8,780,628 B2 | * | 7/2014 | Lin | H01L 27/11526 365/185.05 |
| 9,287,282 B2 | | 3/2016 | Hsieh et al. | |
| 9,379,121 B1 | * | 6/2016 | Chen | H01L 29/517 |
| 9,431,256 B2 | * | 8/2016 | Hsu | H01L 29/40114 |
| 9,911,847 B1 | * | 3/2018 | Chin | H01L 29/42344 |

(Continued)

OTHER PUBLICATIONS

M. Zakaria et al., "A Simulation Study of the Effect Engineered Tunnel Barrier to the Floating Gate Flash Memory Devices", 2012, IEEE, ICSE2012 Proceedings, pp. 224-228. (Year: 2012).*

(Continued)

*Primary Examiner* — Victoria K. Hall
(74) *Attorney, Agent, or Firm* — J.C. Patents

(57) ABSTRACT

A structure of a memory device and a fabrication method thereof are provided. The structure of the memory device includes a tunneling layer disposed on a substrate. A first oxide/nitride/oxide (ONO) layer is disposed on the substrate abutting to the tunneling layer. A floating gate is disposed on the tunneling layer, wherein a side portion of the floating gate is also disposed on the first ONO layer. A second ONO layer is disposed on the floating gate. A control gate is disposed on the second ONO layer. An isolation layer is disposed on first sidewalls of the floating gate and sidewalls of the control gate. An erase gate is disposed on the first ONO layer, wherein the erase gate is isolated from the floating gate and the control gate by the isolation layer.

20 Claims, 9 Drawing Sheets

(56) References Cited

U.S. PATENT DOCUMENTS

| | | | | |
|---|---|---|---|---|
| 10,192,874 B2* | 1/2019 | Yi | ............. | H01L 27/11524 |
| 10,622,073 B2* | 4/2020 | Bo | ............. | H01L 27/10829 |
| 10,727,239 B2* | 7/2020 | Tailliet | ............. | G11C 16/08 |
| 10,811,426 B2* | 10/2020 | Wu | ............. | H01L 29/40117 |
| 2003/0119258 A1* | 6/2003 | Pascucci | ............. | H01L 27/11568 |
| | | | | 438/257 |
| 2003/0198086 A1* | 10/2003 | Shukuri | ............. | H01L 27/11521 |
| | | | | 365/185.18 |
| 2003/0203557 A1 | 10/2003 | Rudeck | | |
| 2004/0164359 A1* | 8/2004 | Iwata | ............. | H01L 29/792 |
| | | | | 257/379 |
| 2005/0207225 A1* | 9/2005 | Chen | ............. | H01L 27/115 |
| | | | | 365/185.17 |
| 2006/0014345 A1* | 1/2006 | Hsu | ............. | H01L 29/40117 |
| | | | | 438/257 |
| 2008/0217675 A1* | 9/2008 | Liu | ............. | H01L 29/7881 |
| | | | | 257/321 |
| 2008/0248620 A1* | 10/2008 | Liu | ............. | H01L 29/6656 |
| | | | | 438/257 |
| 2010/0044773 A1* | 2/2010 | Ishigaki | ............. | H01L 29/7881 |
| | | | | 257/320 |
| 2013/0313626 A1* | 11/2013 | Huang | ............. | H01L 29/66825 |
| | | | | 257/321 |
| 2016/0163722 A1* | 6/2016 | Chang | ............. | H01L 29/40114 |
| | | | | 257/316 |
| 2016/0190268 A1 | 6/2016 | Wu et al. | | |
| 2016/0204274 A1* | 7/2016 | Fan | ............. | H01L 21/26513 |
| | | | | 257/319 |
| 2017/0110469 A1* | 4/2017 | Yi | ............. | H01L 29/42336 |
| 2017/0301683 A1* | 10/2017 | Chen | ............. | H01L 29/42328 |
| 2018/0019251 A1 | 1/2018 | Tsao et al. | | |
| 2018/0233509 A1* | 8/2018 | Cai | ............. | H01L 27/11519 |
| 2018/0315764 A1* | 11/2018 | Yang | ............. | H01L 29/40114 |
| 2018/0366478 A1* | 12/2018 | Yi | ............. | H01L 29/66825 |
| 2019/0027487 A1* | 1/2019 | Chen | ............. | H01L 21/26513 |
| 2019/0067305 A1* | 2/2019 | Shih | ............. | H01L 29/7831 |
| 2019/0140063 A1* | 5/2019 | Liu | ............. | H01L 29/66825 |
| 2020/0035304 A1* | 1/2020 | Tailliet | ............. | G11C 16/10 |

OTHER PUBLICATIONS

Mohd Rosydi Zakaria et al., "A simulation study of the effect engineered tunnel barrier to the floating gate flash memory devices," 2012 10th IEEE International Conference on Semiconductor Electronics (ICSE), Sep. 19-21, 2012, pp. 224-228.

"Search Report of Europe Counterpart Application", dated Oct. 2, 2020, pp. 1-9.

* cited by examiner

STRUCTURE OF MEMORY DEVICE AND FABRICATION METHOD THEREOF

CROSS-REFERENCE TO RELATED APPLICATION

This application claims the priority benefit of Chinese patent application serial no. 201910418713.2, filed on May 20, 2019. The entirety of the above-mentioned patent application is hereby incorporated by reference herein and made a part of this specification.

BACKGROUND OF THE INVENTION

1. Field of the Invention

The present invention relates to a semiconductor fabrication technology, and more particularly to a structure of a memory device and a fabrication method thereof.

2. Description of Related Art

A non-volatile memory is almost a necessity in digital electronic products. Digital electronic products such as computers, mobile phones, cameras, and video recorders are also indispensable products in daily life. Therefore, the non-volatile memory is generally required.

The non-volatile memory is, for example, a flash memory including a control gate and a floating gate. Since the data stored in the memory is frequently changed according to actual operations, in addition to the operations of writing and reading, the operation of erasing data is often performed. Therefore, the efficiency of erasing data also affects the overall performance of the memory.

The structure of the flash memory is also continuing to be developed in order to improve the overall performance of the memory.

SUMMARY OF THE INVENTION

The present invention provides a structure of a memory device and a fabrication method thereof. The memory device is a structure based on a structure including a control gate and a floating gate, which can reduce the capacitance value between the floating gate and an erase gate and increase the capacitance value between the floating gate and a substrate, thereby improving the efficiency of erasing data.

In one embodiment, the present invention provides a structure of a memory device, including a tunneling layer disposed on a substrate. A first oxide-nitride-oxide (ONO) layer is disposed on the substrate abutting to the tunneling layer. A floating gate is disposed on the tunneling layer, wherein a side portion of the floating gate is also disposed on the first ONO layer. A second ONO layer is disposed on the floating gate. A control gate is disposed on the second ONO layer. An isolation layer is disposed on first sidewalls of the floating gate and sidewalls of the control gate. An erase gate is disposed on the first ONO layer, wherein the erase gate is isolated from the floating gate and the control gate by the isolation layer.

In one embodiment, the structure of the memory device further includes a vertical dielectric layer on second sidewalls of the side portion of the floating gate, wherein the second sidewalls abut to a shallow trench isolation structure and are merged with the first ONO layer.

In one embodiment, for the structure of the memory device, the vertical dielectric layer occupies a space to reduce a width of the floating gate.

In one embodiment, for the structure of the memory device, the vertical dielectric layer includes an oxide layer and a nitride layer stacked on the second sidewalls.

In one embodiment, for the structure of the memory device, the isolation layer includes a first portion disposed on the first sidewalls of the floating gate and a second portion disposed on the sidewalls of the control gate.

In one embodiment, for the structure of the memory device, the first portion of the isolation layer is an oxide layer, and the second portion of the isolation layer is a third ONO layer.

In one embodiment, for the structure of the memory device, the control gate does not completely cover over the side portion of the floating gate.

In one embodiment, for the structure of the memory device, the erase gate includes a protruding portion at a top region, covering over the side portion of the floating gate and isolated by a portion of the isolation layer.

In one embodiment, for the structure of the memory device, the substrate includes: active lines extending in a first direction; and shallow trench isolation lines to isolate the active lines. The control gate is a control gate line and the erase gate is an erase gate line, and the control gate and the erase gate extend in a second direction perpendicular to the first direction.

In one embodiment, for the structure of the memory device, the substrate includes a P-type well region and an N-type well region in the P-type well region, wherein the floating gate covers over the P-type well region and the N-type well region, and the erase gate covers over the N-type well region.

In one embodiment, the present invention also provides a method of fabricating a memory device, including: a tunneling layer is formed on a substrate. The method further includes that a first oxide/nitride/oxide (ONO) layer abutting to the tunneling layer is formed on the substrate. A floating gate is formed on the tunneling layer, wherein a side portion of the floating gate is also disposed on the first ONO layer. A second ONO layer is formed on the floating gate. A control gate is formed on the second ONO layer. An isolation layer is formed on first sidewalls of the floating gate and sidewalls of the control gate. An erase gate is formed on the first ONO layer, wherein the erase gate is isolated from the floating gate and the control gate by the isolation layer.

In one embodiment, the method of fabricating the memory device further includes that a vertical dielectric layer is formed on second sidewalls of the side portion of the floating gate. The second sidewalls abut to a shallow trench isolation structure and are merged with the first ONO layer.

In one embodiment, for the method of fabricating the memory device, the vertical dielectric layer occupies a space to reduce a width of the floating gate.

In one embodiment, for the method of fabricating the memory device, the vertical dielectric layer includes an oxide layer and a nitride layer stacked on the second sidewalls.

In one embodiment, for the method of fabricating the memory device, the formed isolation layer includes a first portion disposed on the first sidewalls of the floating gate and a second portion disposed on the sidewalls of the control gate.

In one embodiment, for the method of fabricating the memory device, the first portion of the isolation layer is an oxide layer, and the second portion of the isolation layer is a third ONO layer.

In one embodiment, for the method of fabricating the memory device, the control gate does not completely cover over the side portion of the floating gate.

In one embodiment, for the method of fabricating the memory device, the erase gate includes a protruding portion at a top region, covering over the side portion of the floating gate and isolated by a portion of the isolation layer.

In one embodiment, for the method of fabricating the memory device, the formed substrate includes: active lines extending in a first direction; and shallow trench isolation lines to isolate the active lines. The control gate is a control gate line and the erase gate is an erase gate line, and the control gate and the erase gate extend in a second direction perpendicular to the first direction.

In one embodiment, for the method of fabricating the memory device, the substrate includes a P-type well region and an N-type well region in the P-type well region, wherein the floating gate covers over the P-type well region and the N-type well region, and the erase gate covers over the N-type well region.

BRIEF DESCRIPTION OF THE DRAWINGS

The accompanying drawings are included to provide a further understanding of the present invention. The accompanying drawings are incorporated into and constitute a part of this specification. The accompanying drawings illustrate the embodiments of the present invention, and serve to explain the principles of the present invention together with the description.

DESCRIPTION OF THE EMBODIMENTS

The present invention relates to a structure of a memory device and a fabrication method thereof. In one embodiment, the memory device is a structure based on a structure including a control gate and a floating gate. The structure of the memory device provided by the present invention can reduce the capacitance value between the floating gate and the erase gate and increase the capacitance value between the floating gate and the substrate, thereby improving the efficiency of erasing data.

The present invention is illustrated by the following embodiments, but the present invention is not limited to the embodiments. These embodiments can also be combined with each other.

The present invention proposes to look into the possible drawbacks of the structure of the memory before proposing improvements to the structure of the memory device.

Figure 1A:
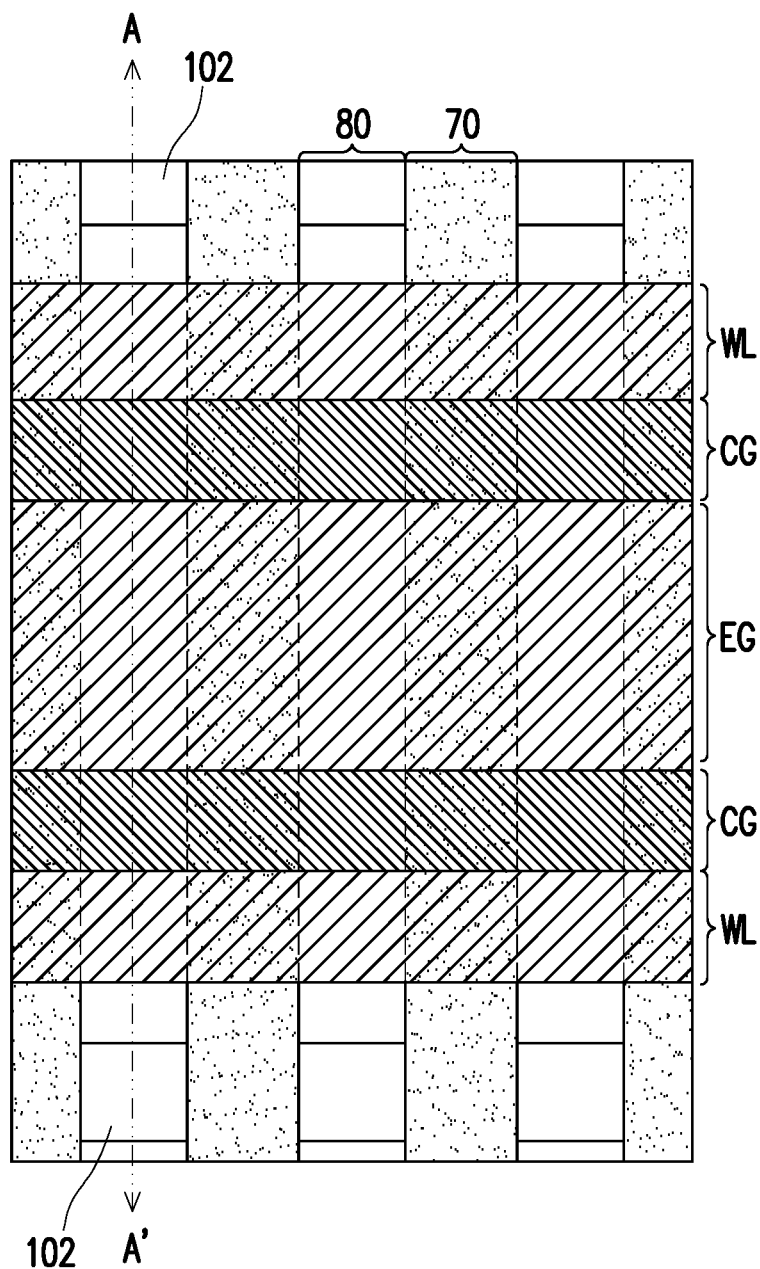
FIG. 1A is a layout view of a memory device in accordance with the present invention.
Figure 1B:
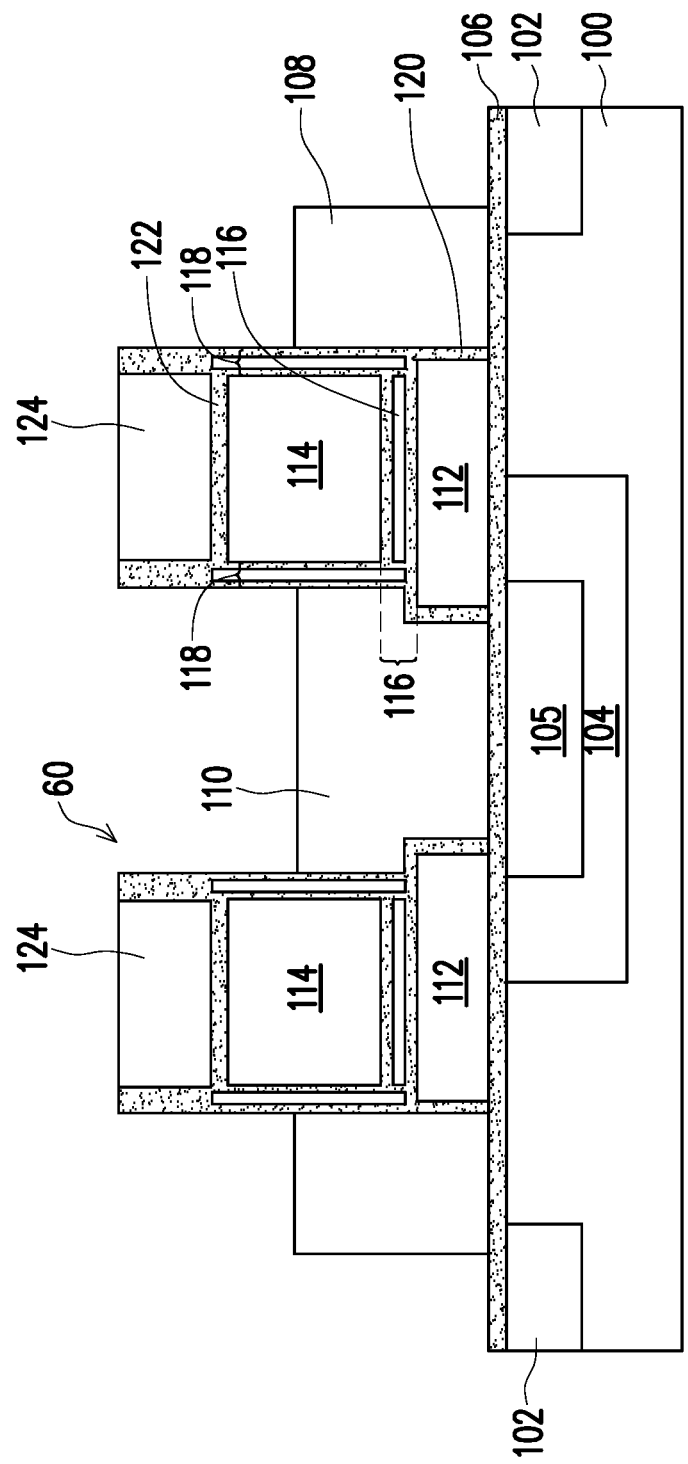
FIG. 1B is a cross-sectional view of the memory device in accordance with the present invention taken along cutting line A-A' of FIG. 1A.

FIG. 1A is a drawing, schematically illustrating a layout view of a memory device in accordance with the present invention. FIG. 1B is a drawing, schematically illustrating a cross-sectional view of the memory device in accordance with the present invention taken along cutting line A-A' of FIG. 1A. According to FIG. 1A and FIG. 1B, memory cells of the memory device 60 are distributed in arrays. From the top view layout, a plurality of active lines 80 on a substrate 100 extends in a first direction as an active region of a component. The memory cells of the memory device 60 are fabricated on the region of the active lines 80 of the substrate 100. A plurality of shallow trench isolation structures 70 is also formed on the substrate 100 to isolate the active lines 80. The memory device 60 further includes a floating gate 112, a control gate 114, and an erase gate 110, which are also linear structures extending in a second direction that is perpendicular to the first direction. The control gate 114 and the erase gate 110 of FIG. 1B correspond to the control gates 114 and CG and the erase gates 110 and EG of FIG. 1A. Furthermore, word lines 108 and WL are on the other side of the control gates 114 and CG. The intersection region of the active line 80 and the control gates 114 and CG has the floating gate 112 and constitutes a memory cell of the memory device 60.

As can be seen more clearly from FIG. 1B, the region of the active line 80 of the substrate 100 is formed with a P-type well region which is a doped region of the substrate 100. In the P-type well region, an N-type well region 104 is formed corresponding to the erase gate 100, and in the N-type well region 104, an N-type doped region 105 with a large concentration is formed in the substrate 100 below the erase gate 110, and is used as a selection line. An N-type doped region 102 to be connected to a bit line is also formed at both ends of the active line.

An oxide layer 106 is first formed on the substrate. A portion of the oxide layer 106 corresponding to the floating gate 112 also serves as a tunneling layer. On the other hand, the oxide layer 106 also provides the floating gate 112 and a gate insulation layer of the substrate 100 opposite to the erase gate 100. The floating gate 112 and the control gate 114 are stacked on the oxide layer 106. An oxide/nitride/oxide (ONO) layer 116 is arranged between the floating gate 112 and the control gate 114. The gate insulation layer between the floating gate 112 and the substrate 100 is provided by a portion of the oxide layer 106. The sidewalls of the control gate 114 comprise an isolation layer 118, such as an ONO structure, to isolate the upper portion of the erase gate 110. The gate insulation layer between the erase gate 110 and the substrate 100 is also provided by a portion of the oxide layer 106. The lower portion of the erase gate 110 is also isolated by the isolation layer 120, such as oxide layer, from the floating gate 112. As needed, the top of the control gate 114 also comprises a nitride layer as a protective mask layer 124.

In addition, the protective mask layer 124 may also include an oxide layer 122 at the bottom part on the control gate 114. The sidewalls of the mask layer 124 in the present embodiment are covered by the oxide layer. However, in another embodiment, the sidewalls of the mask layer 124 may also extend from the isolation layer 118, also being an ONO structure. The present invention is not limited to the embodiments provided.

For the structure of the memory device of FIG. 1B. In the data erasing operation, a capacitor $C_{eg\text{-}fg}$ exists between the erase gate 110 and the floating gate 112, and another capacitor $C_{fg\text{-}sub}$ also exists between the floating gate 112 and the substrate 100.

The present invention looks into, for example, the structure of FIG. 1B and finds that the smaller the capacitance value of the capacitor $C_{eg\text{-}fg}$, the better the erasing efficiency. In addition, the larger the capacitance value of the capacitor $C_{fg\text{-}sub}$, the better the erasing efficiency.

In one embodiment, the present invention further provides a further design of the memory device to at least reduce the capacitance value of the capacitor $C_{eg\text{-}fg}$ and increase the capacitance value of the capacitor $C_{fg\text{-}sub}$. In this way, at least the performance of the memory device on the erasing operation can be improved.

Figure 2:
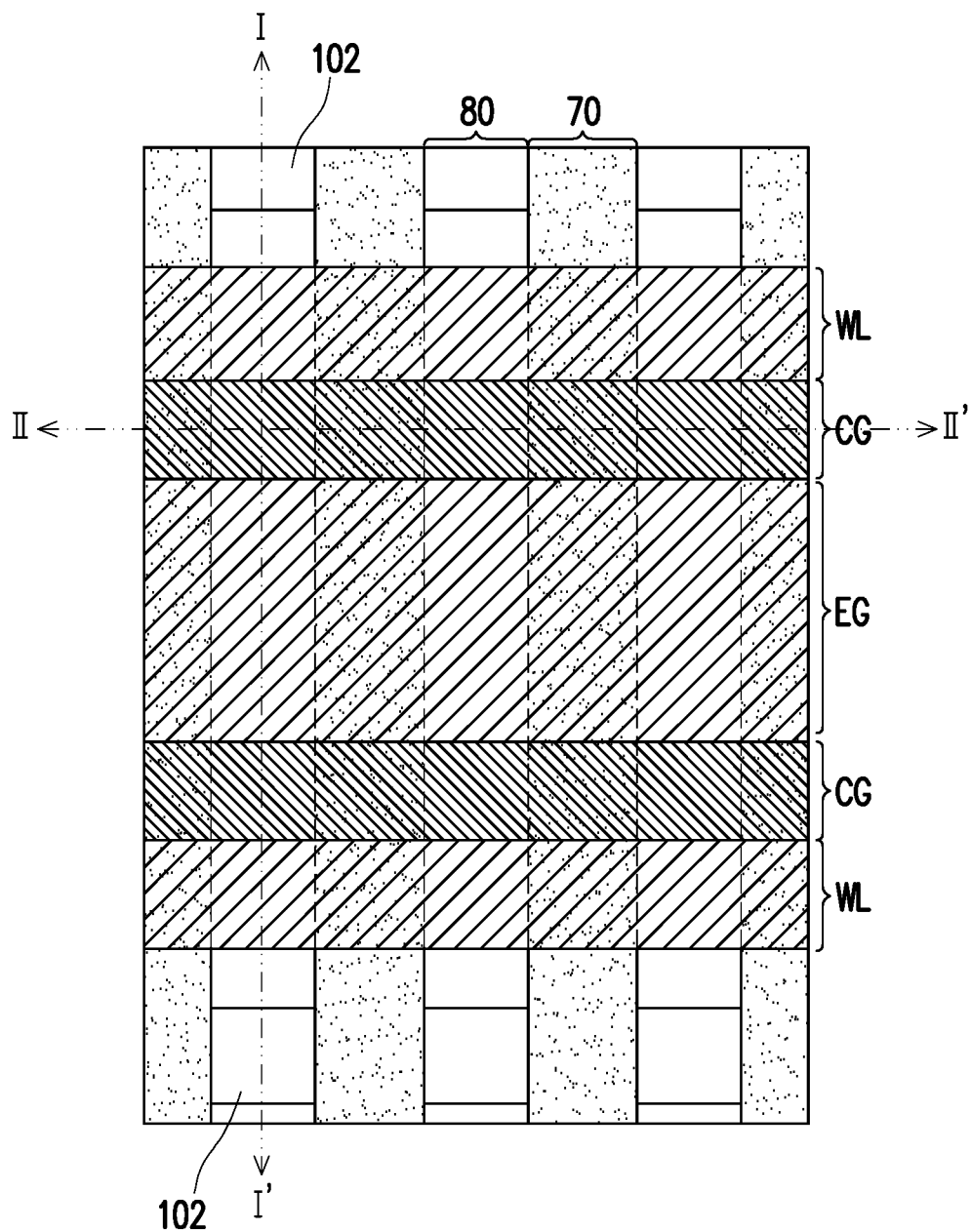
FIG. 2 is a layout view of a memory device in accordance with one embodiment of the present invention.

FIG. 2 is a drawing, schematically illustrating a layout view of the memory device in accordance with one embodiment of the present invention. According to FIG. 2, the layout of the memory device is similar to that described in FIG. 1B, but the structure of the floating gate 112 is further adjusted. In order to be able to understand the more detailed structure, the cross-sectional structure corresponding to cutting lines I-I' and II-II' is described in detail below.

Figure 3:
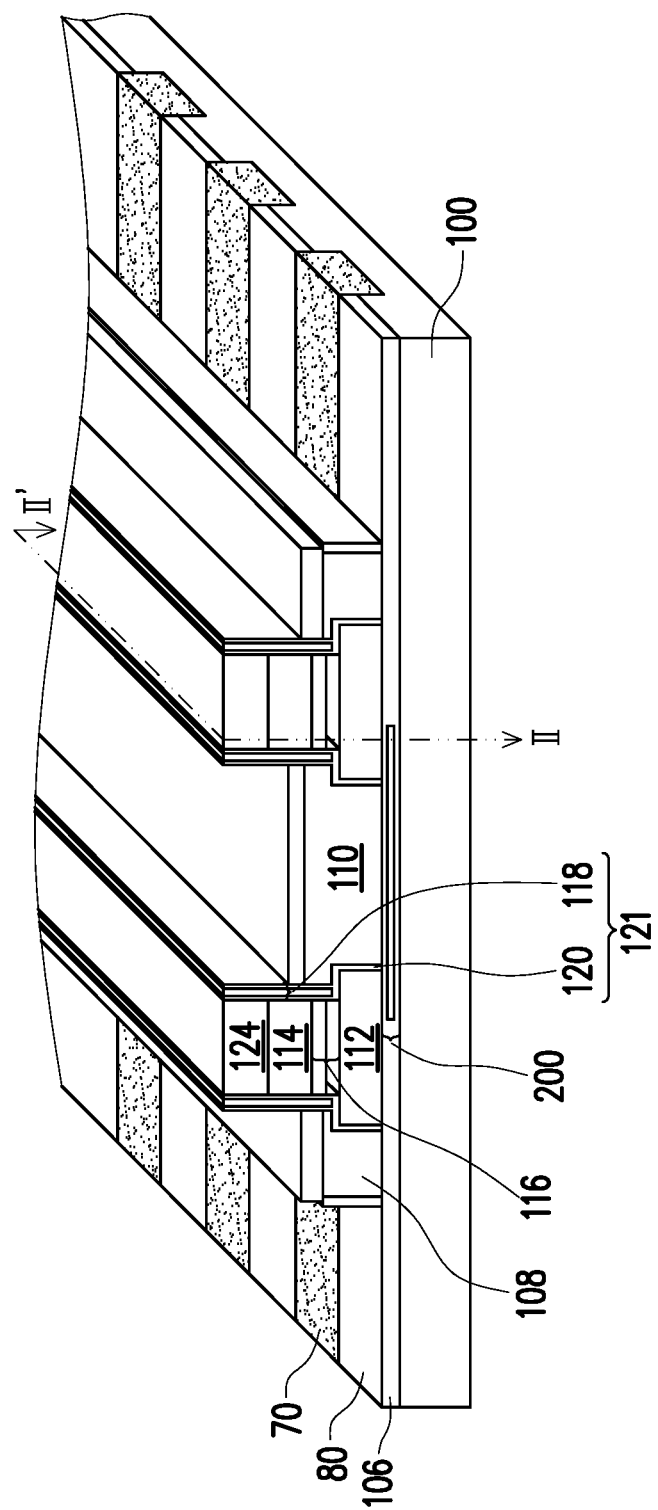
FIG. 3 is a cross-sectional and three-dimensional view of the memory device 2 taken along cutting line I-I' of FIG. 2 in accordance with one embodiment of the present invention.

FIG. 3 is a drawing, schematically illustrating a cross-sectional and three-dimensional view of the memory device taken along the cutting line I-I' of FIG. 2 in accordance with one embodiment of the present invention. According to FIG. 2 and FIG. 3, a plurality of active lines 80 are formed on the substrate 100. A plurality of shallow trench isolation structures 70 is also formed on the substrate 100 to isolate the active lines 80. The active line 80 is a doped region in the substrate 100. An oxide layer 106 is formed on the active line 80.

In one embodiment, the basic structure of the floating gate 112, the control gate 114, the erase gate 110, and the like of the memory device is similar to that of FIG. 1B, and an ONO layer 116 is arranged between the floating gate 112 and the control gate 114. Parts similar to those of FIG. 1B will be omitted herein. In addition, other components of the same reference numerals will be omitted herein.

The further features of the present invention are described below in accordance with an embodiment. In the present invention, an ONO layer 200 is formed between the erase gate 110 and the substrate 100 to replace a portion of the oxide layer 106. The ONO layer 200 also extends to the side portion of the floating gate 112. The isolation layer 118 and the isolation layer 120 may be integrated into two portions of the isolation layer 121 at the sidewalls of the floating gate 112 and the control gate to achieve an isolation effect. In one embodiment, the side portion of the floating gate 112 is, for example, corresponding to the region covered by the upper portion of the erase gate 110.

The cutting line II-II' indicated in FIG. 2 is shown in FIG. 3 to pass through the side portion of the floating gate 112, so that the structural relationship between the ONO layer 200 and the floating gate 112 is clearly described. The floating gate 112 is provided corresponding to the region of the memory cell, and is used for controlling stored charges to conduct the operation on the memory cell. In other words, the floating gate 112 is not a linearly extending structure.

Figure 4:
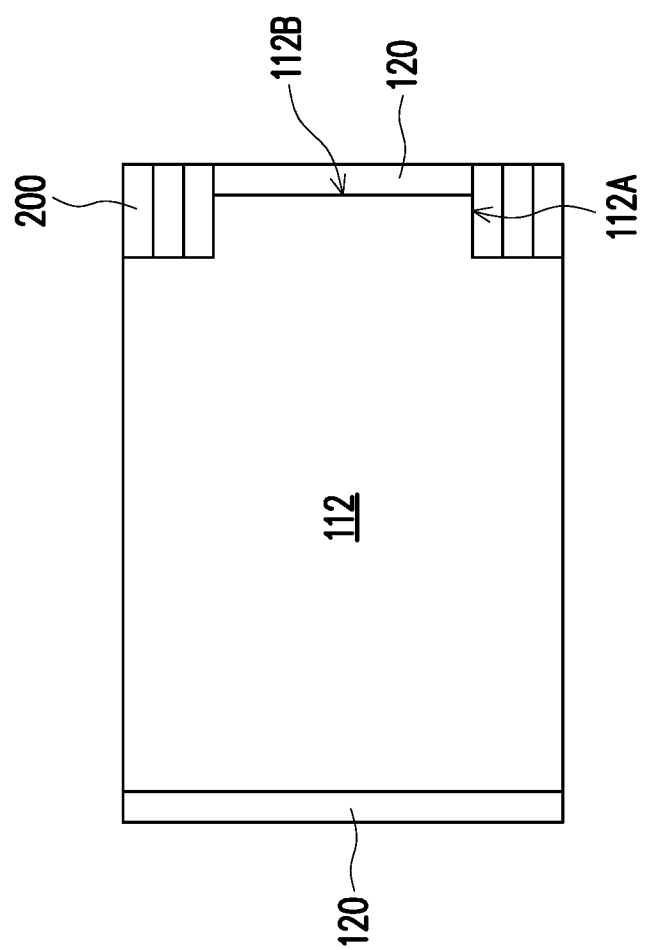
FIG. 4 is a top view of a floating gate of a memory device in accordance with one embodiment of the present invention.
Figure 5:
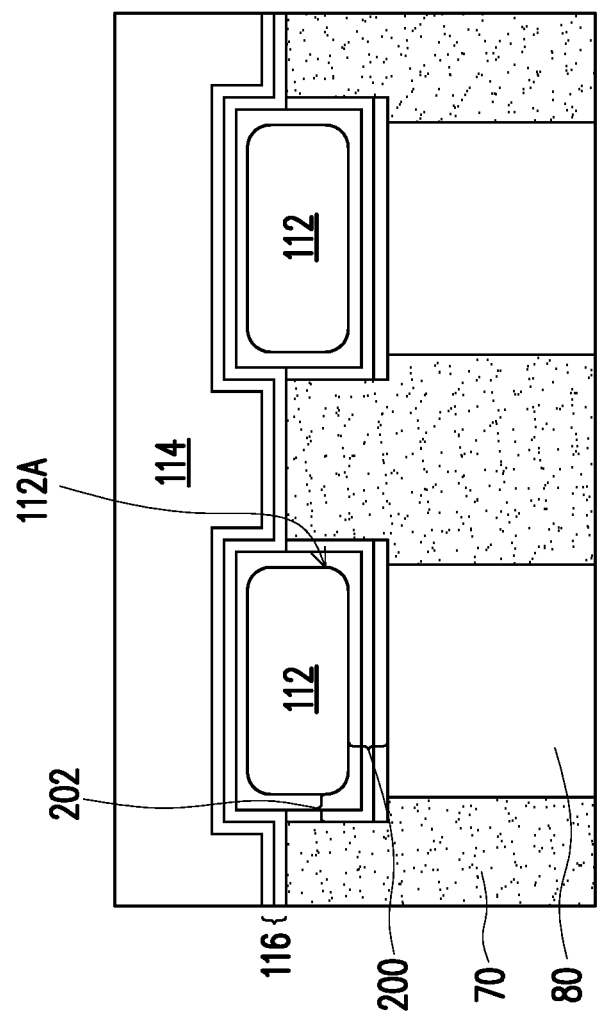
FIG. 5 is a cross-sectional view of the memory device taken along cutting line II-II' of FIG. 2 in accordance with one embodiment of the present invention.

FIG. 4 is a drawing, schematically illustrating a top view of a floating gate of a memory device in accordance with one embodiment of the present invention. According to FIG. 4, in one embodiment, the floating gate 112 is substantially rectangular or square in geometry as viewed from above. The sidewalls 112B of the floating gate 112 are protected by an isolation layer 120. However, since the ONO layer 200 also extends to the side portion of the floating gate 112, in one embodiment, the other pair of sidewalls 112A of the floating gate 112 are also covered, for example, by the ONO layer 200. In one embodiment, as shown in FIG. 5, which will be described later, a dielectric material covering the sidewalls 112A of the floating gate 112 may generally be a vertical dielectric layer 202. Since the ONO layer 200 occupies the space, the width of the subsequently formed floating gate 112 at the side portion is reduced. Thus, the area between the floating gate 112 and the erase gate 110 is reduced, and the capacitor $C_{eg\text{-}fg}$ generated by the relative has a small capacitance value. After the research of the present invention, the present invention finds that the capacitor $C_{eg\text{-}fg}$ with a smaller capacitance value is advantageous for the erasing operation of the memory device. In addition, since the ONO layer 200 also extends below the floating gate 112, the capacitance value of the capacitor $C_{fg\text{-}sub}$ is also increased, which is also advantageous for the erasing operation of the memory device. Embodiments are provided below to describe the generation mechanism of the capacitor in more detail.

FIG. 5 is a drawing, schematically illustrating a cross-sectional view of the memory device taken along the cutting line II-II' of FIG. 2 in accordance with one embodiment of the present invention. According to FIG. 5, in one embodiment, the floating gate 112 along the cutting line II-II' in FIG. 2 is on the active line 80 of the substrate. The active line 80 is isolated by a shallow trench isolation structure 70. The active line 80 comprises the ONO layer 200 thereon. The floating gate 112 is formed on the ONO layer 200. The upper surface of the floating gate 112 comprises an ONO layer 116 that extends in another direction. The control gate 114 also extends in the another direction and is formed on the ONO layer 116.

In one embodiment, the ONO layer 200 of the present invention is also formed on the sidewalls 112A of the side portion of the floating gate 112. The portion of the sidewalls 112A may be considered as the vertical dielectric layer 202 in terms of general effect of adjusting the capacitance value. That is, the vertical dielectric layer 202 may not be an ONO structure as the ONO layer 200. In one embodiment, the vertical dielectric layer 202 may include, for example, an oxide layer and a nitride layer. The stack of vertical dielectric layers 202 can be formed correspondingly by the employed fabricating process. The vertical dielectric layer 202 is formed first, and then the floating gate 112 is filled, so that the floating gate 112 is surrounded and occupied by the vertical dielectric layer 202 and thus recessed at the side portion. As the thickness of the vertical dielectric layer 202 is increased, the width of the floating gate 112 is reduced, and the capacitance value generated is also reduced, which is advantageous for the erasing operation.

Figure 6:
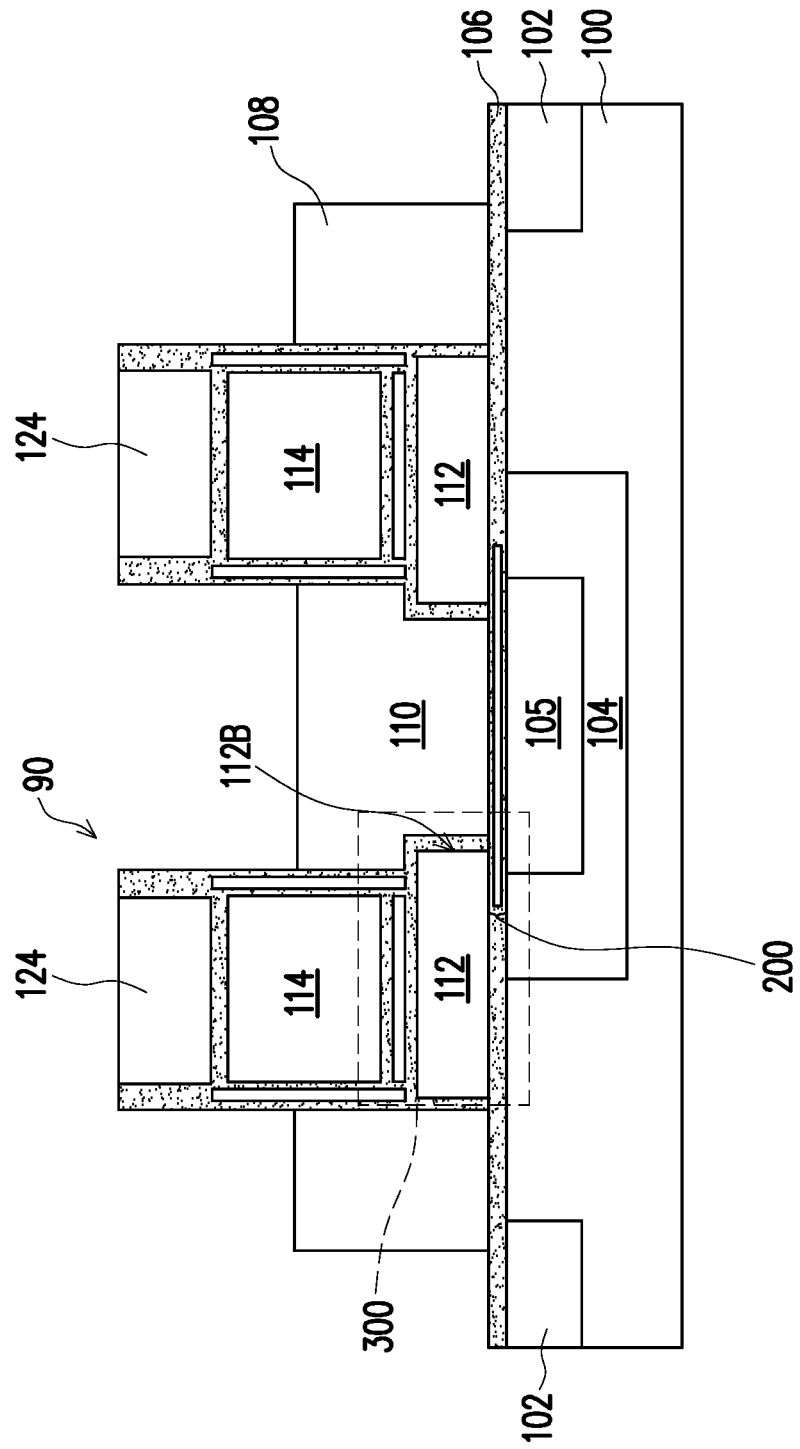
FIG. 6 is a cross-sectional view of the memory device taken along the cutting line I-I' of FIG. 2 in accordance with one embodiment of the present invention.

FIG. 6 is a drawing, schematically illustrating a cross-sectional view of the memory device taken along the cutting line I-I' of FIG. 2 in accordance with one embodiment of the present invention. According to FIG. 6, the structure of the memory device 90 is the same as the cross-sectional structure of the end face of FIG. 3. In one embodiment, as described above, the sidewall of the mask layer 124 may be a general oxide layer, and does not need to extend from the isolation layer 118, or substantially change the formation of the ONO layer 200 and the vertical dielectric layer 202. The sidewalls 112B of the side portion of the floating gate 112 are isolated by the isolation layer 120 from the lower portion of the erase gate 110.

In the region 300 indicated, the ONO layer 200 produces a capacitance effect between the floating gate 112 and the substrate 100.

Figure 8:
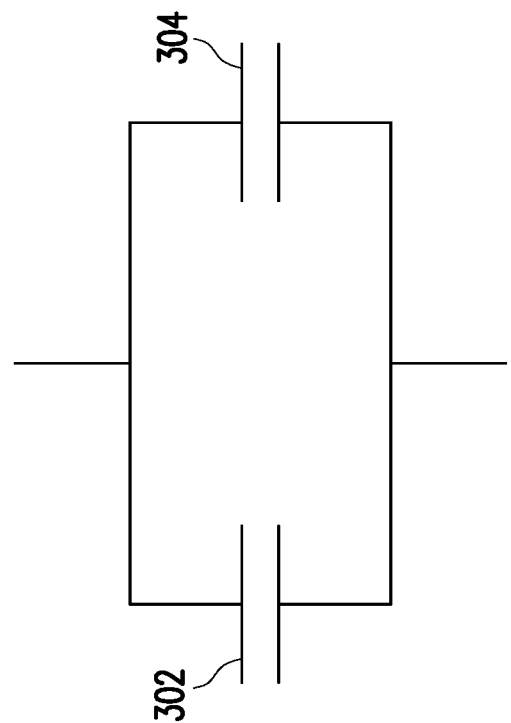
FIG. 8 is a schematic view showing the capacitive effect of a memory device between a floating gate and a substrate in FIG. 7 in accordance with one embodiment of the present invention.
Figure 7:
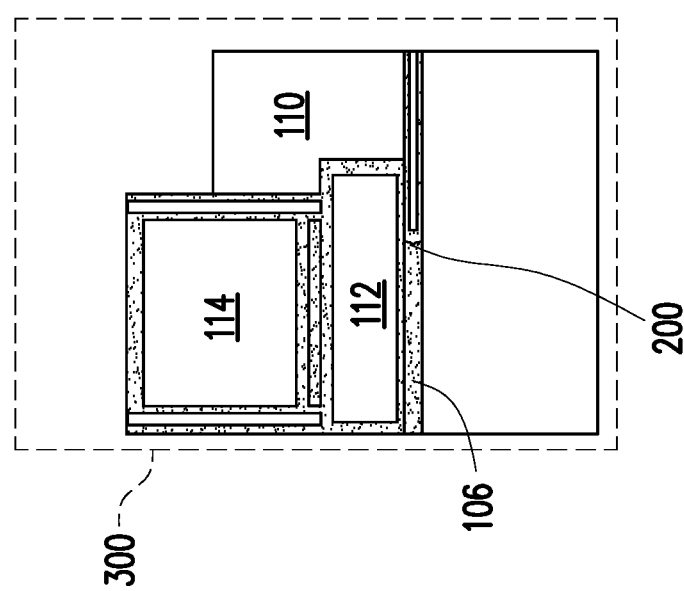
FIG. 7 is a partial enlarged view of a memory device in accordance with one embodiment of the present invention.

FIG. 7 is a drawing, schematically illustrating a partial enlarged view of a memory device in accordance with one embodiment of the present invention. FIG. 8 is a drawing, schematically illustrating a schematic view showing the capacitive effect of the memory device between the floating gate and the substrate in FIG. 7 in accordance with one embodiment of the present invention.

According to FIG. 7 and FIG. 8, the ONO layer 200 extends to the side portion of the floating gate 112 and is located between the floating gate 112 and the substrate 100 to constitute an equivalent capacitor 304. In addition, the oxide layer 106 between the floating gate 112 and the substrate 100 constitutes an equivalent capacitor 302. The capacitor 302 is connected in parallel with the capacitor 304. Since the ONO layer 200 provides a larger average dielectric constant value, a larger capacitance value is produced. In terms of a circuit, the total capacitance value of the capacitor $C_{fg\text{-}sub}$ increases, which is advantageous for the erasing operation.

Figure 9:
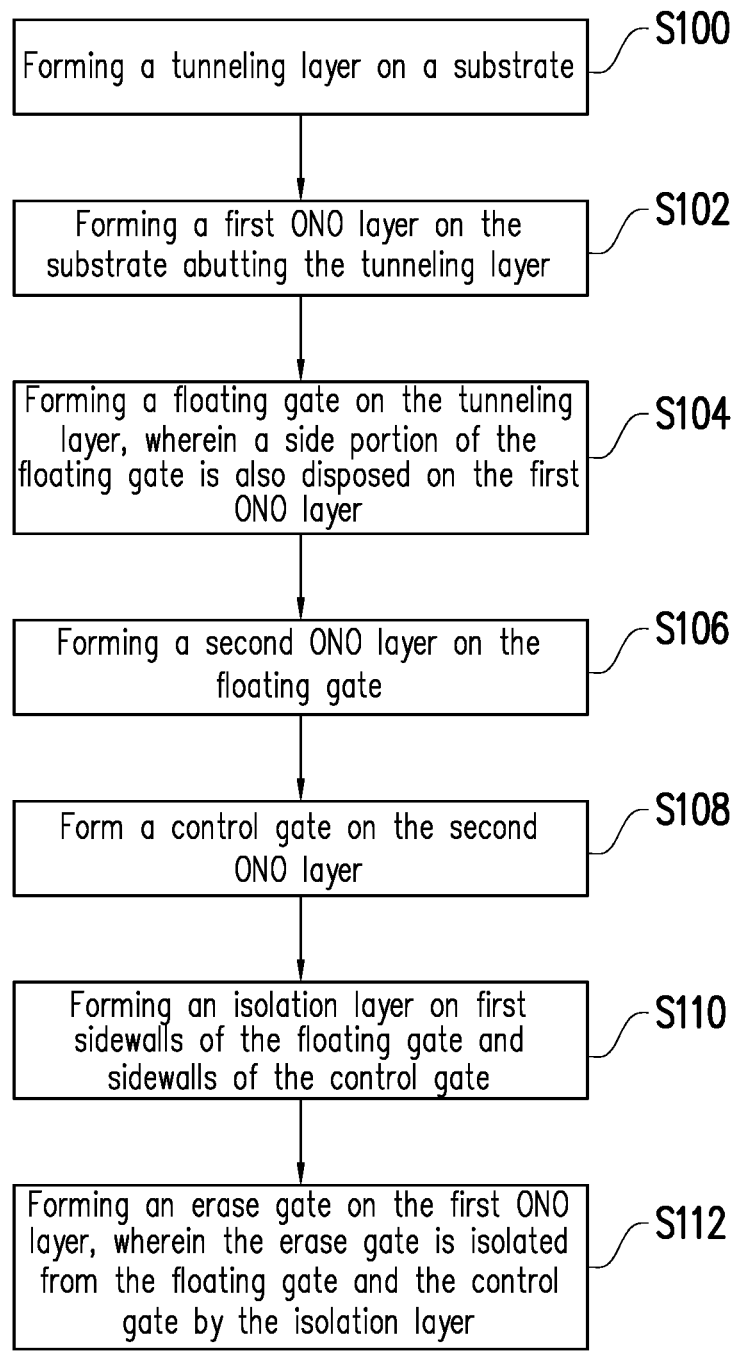
FIG. 9 is a flow chart of a method of fabricating a memory device in accordance with one embodiment of the present invention.

Features of the present invention are described below in terms of a semiconductor fabrication process. FIG. 9 a drawing, schematically illustrating is a flow chart of a method of fabricating the memory device in accordance with one embodiment of the present invention.

According to FIG. 9, in one embodiment, the present invention also provides a method of fabricating the memory device, including: a tunneling layer is formed on a substrate as shown in step S100. The method further includes step S102 in which a first oxide/nitride/oxide layer abutting to the tunneling layer is formed on the substrate. In step S104, a floating gate is formed on the tunneling layer, wherein a side portion of the floating gate is also disposed on the first ONO layer. In step S106, a second ONO layer is formed on the floating gate. In step S108, a control gate is formed on the second ONO layer. In step S110, an isolation layer is formed on first sidewalls of the floating gate and sidewalls of the control gate. In step S112, an erase gate is formed on the first ONO layer, wherein the erase gate is isolated from the floating gate and the control gate by the isolation layer.

In one embodiment, the method of fabricating the memory device further includes that a vertical dielectric layer 202 is formed on sidewalls 112A of the side portion of the floating gate 112. The sidewalls 112A abut to a shallow trench isolation structure 70 and are merged with the ONO layer 200.

Finally, it should be noted that the above embodiments are only used to illustrate instead of limiting the technical solutions of the present invention. Although the present invention has been described in detail with reference to the foregoing embodiments, those skilled in the art should understand that the technical solutions described in the foregoing embodiments may be modified or equivalently substituted for some or all of the technical features. These modifications and substitutions do not depart from the scope of the technical solutions of the embodiments of the present invention.

What is claimed is:

1. A structure of a memory device, comprising:
   a tunneling layer, disposed on a substrate;
   a first oxide/nitride/oxide (ONO) layer, disposed on the substrate abutting to the tunneling layer;
   a floating gate, disposed on the tunneling layer, wherein a side portion of the floating gate is also disposed on the first ONO layer;
   a second ONO layer, disposed on the floating gate;
   a control gate, disposed on the second ONO layer;
   an isolation layer, disposed on first sidewalls of the floating gate and sidewalls of the control gate; and
   an erase gate, disposed on the first ONO layer, wherein the erase gate is isolated from the floating gate and the control gate by the isolation layer.

2. The structure of the memory device according to claim 1, further comprising a vertical dielectric layer on second sidewalls of the side portion of the floating gate, wherein the second sidewalls abut to a shallow trench isolation structure and are merged with the first ONO layer.

3. The structure of the memory device according to claim 2, wherein the vertical dielectric layer occupies a space to reduce a width of the floating gate.

4. The structure of the memory device according to claim 2, wherein the vertical dielectric layer comprises an oxide layer and a nitride layer stacked on the second sidewalls.

5. The structure of the memory device according to claim 1, wherein the isolation layer comprises a first portion disposed on the first sidewalls of the floating gate and a second portion disposed on the sidewalls of the control gate.

6. The structure of the memory device according to claim 5, wherein the first portion of the isolation layer is an oxide layer, and the second portion of the isolation layer is a third ONO layer.

7. The structure of the memory device according to claim 1, wherein the control gate does not completely cover over the side portion of the floating gate.

8. The structure of the memory device according to claim 7, wherein the erase gate comprises a protruding portion at a top region, covering over the side portion of the floating gate and isolated by a portion of the isolation layer.

9. The structure of the memory device according to claim 1, wherein the substrate comprises:
   active lines extending in a first direction; and
   shallow trench isolation lines to isolate the active lines, wherein the control gate is a control gate line and the erase gate is an erase gate line, and the control gate line and the erase gate line extend in a second direction perpendicular to the first direction.

10. The structure of the memory device according to claim 1, wherein the substrate comprises a P-type well region and an N-type well region in the P-type well region, wherein the floating gate covers over the P-type well region and the N-type well region, and the erase gate covers over the N-type well region.

11. A method of fabricating a memory device, comprising:
   forming a tunneling layer on a substrate;
   forming a first oxide/nitride/oxide (ONO) layer on the substrate abutting to the tunneling layer;
   forming a floating gate on the tunneling layer, wherein a side portion of the floating gate is also disposed on the first ONO layer;
   forming a second ONO layer on the floating gate;
   forming a control gate on the second ONO layer;
   forming an isolation layer on first sidewalls of the floating gate and sidewalls of the control gate; and forming an erase gate on the first ONO layer, wherein the erase gate is isolated from the floating gate and the control gate by the isolation layer.

12. The method of fabricating the memory device according to claim 11, further comprising:
   forming a vertical dielectric layer on second sidewalls of the side portion of the floating gate,
   wherein the second sidewalls abut to a shallow trench isolation structure and are merged with the first ONO layer.

13. The method of fabricating the memory device according to claim 12, wherein the vertical dielectric layer occupies a space to reduce a width of the floating gate.

14. The method of fabricating the memory device according to claim 12, wherein the vertical dielectric layer comprises an oxide layer and a nitride layer stacked on the second sidewalls.

15. The method of fabricating the memory device according to claim 11, wherein the formed isolation layer comprises a first portion disposed on the first sidewalls of the floating gate and a second portion disposed on the sidewalls of the control gate.

16. The method of fabricating the memory device according to claim 15, wherein the first portion of the isolation layer is an oxide layer, and the second portion of the isolation layer is a third ONO layer.

17. The method of fabricating the memory device according to claim 11, wherein the control gate does not completely cover over the side portion of the floating gate.

18. The method of fabricating memory device according to claim 17, wherein the erase gate comprises a protruding portion at a top region, covering over the side portion of the floating gate and isolated by a portion of the isolation layer.

19. The method of fabricating the memory device according to claim 11, wherein the formed substrate comprises:
   active lines extending in a first direction; and
   shallow trench isolation lines to isolate the active lines,
   wherein the control gate is a control gate line and the erase gate is an erase gate line, and the control gate line and the erase gate line extend in a second direction perpendicular to the first direction.

20. The method of fabricating the memory device according to claim 11, wherein the substrate comprises a P-type well region and an N-type well region in the P-type well region, wherein the floating gate covers over the P-type well region and the N-type well region, and the erase gate covers over the N-type well region.

* * * * *